US006643305B2

(12) United States Patent
Bewley et al.

(10) Patent No.: US 6,643,305 B2
(45) Date of Patent: Nov. 4, 2003

(54) OPTICAL PUMPING INJECTION CAVITY FOR OPTICALLY PUMPED DEVICES

(75) Inventors: William W. Bewley, Falls Church, VA (US); Jerry R. Meyer, Catonsville, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 117 days.

(21) Appl. No.: 09/828,187

(22) Filed: Apr. 9, 2001

(65) Prior Publication Data

US 2001/0043636 A1 Nov. 22, 2001

Related U.S. Application Data

(60) Provisional application No. 60/195,193, filed on Apr. 7, 2000.

(51) Int. Cl.[7] .............................. H01S 5/00; H01S 3/093
(52) U.S. Cl. .............................. 372/45; 372/50; 372/72; 372/96
(58) Field of Search .............................. 372/45, 49, 70, 372/72, 96, 99, 50

(56) References Cited

U.S. PATENT DOCUMENTS

| | | | |
|---|---|---|---|
| 5,444,270 A | * 8/1995 | Cunningham et al. | ........ 372/49 |
| 5,513,202 A | 4/1996 | Kobayashi et al. | |
| 5,513,203 A | 4/1996 | Damen | |
| 5,557,627 A | * 9/1996 | Schneider, Jr. et al. | ....... 372/50 |
| 5,985,686 A | 11/1999 | Jayaraman | |
| 6,023,354 A | 2/2000 | Goldstein et al. | |
| 6,026,108 A | 2/2000 | Lim et al. | |
| 6,438,150 B1 | * 8/2002 | Yoo | .............. 372/49 |

OTHER PUBLICATIONS

Vertical–Cavity Surface–Emitting Lasers With Low–Ripple Optical Pump Bands; K.J. Knopp et al.; American Institute of Physics; 1996.

Molecular Beam Epitaxy Engineered III–V Semiconductor Structures for Low–Power Optically Addressed Spatial Light Modulators; Larsson et al; Optical Engineering; Jul. 1992; vol. 31 No. 7.

High–Temperature Continuous–Wave 3–6.1 um "W" Lasers With Diamond–Pressure–Bond Heat Sinking; Bewley et al; Applied Physics Letters; vol. 74, No. 8; Feb. 22, 1999.

High–Efficiency Midinfrared "W" Laser With Optical Pumping Injection Cavity; Felix et al; Applied Physics Letters; vol. 75, No. 19; Nov. 8, 1999.

Resonant Optical Pumping of Vertical–Cavity Semiconductor Lasers (Abstract); Bohn et al.; Proc. SPIE vol. 1850, pp. 127–137, Laser Diode Technology and Applications V, Daniel S. Renner; Ed., Jun. 1993.

* cited by examiner

Primary Examiner—Minh Loan Tran
(74) Attorney, Agent, or Firm—L. George Legg; John J. Karasek

(57) ABSTRACT

An apparatus for receiving optical pump radiation having a wavelength $\lambda_p$ and transmitting pump light to an active region. The apparatus includes a first and second reflector, each reflector being reflective at the wavelength $\lambda_p$, disposed on opposite sides of the active region, where the separation between the reflectors creates a cavity that is resonant at the pump wavelength $\lambda_p$. The separation distance is preferably about $m\lambda_p/2n \cos\theta$, where n is the average index of refraction of the material having an active region, $\theta$ is the angle that the pump beam transverses relative the normal of said reflectors, and m is any positive integer. The apparatus provides low cost, high power, optically pumped edge emitting and surface emitting lasers which can be operated at elevated temperatures or power levels. The apparatus further provides mid-IR, high power optically pumped semiconductor lasers with high pump absorbance, long pump wavelength, and a thin active layer.

50 Claims, 9 Drawing Sheets

EPILAYER-DOWN OPIC COMPONENTS
A) ANTI-REFLECTION COATING
B) SUBSTRATE
C) BOTTOM DBR MIRROR
D) OPIC CAVITY
E) TOP DBR MIRROR
F) METALLIC REFLECTOR
G) HEATSINK
H) ACTIVE REGION
J) INDICENT PUMP BEAM

MATERIALS:
- GaSb (high dielectric material)
- AlSb (low dielectric material)
- $SiO_2$
- Multiple Quantum Well Material
- Metal EPILAYER-UP OPIC COMPONENTS:
B) SUBSTRATE
C) BOTTOM DBR MIRROR
D) OPIC CAVITY
E) TOP DBR MIRROR
F) METALLIC REFLECTOR
H) ACTIVE REGION
J) INCIDENT PUMP BEAM
K) TRANSPARENT HEAT SINK MATERIALS:
- GaSb (high dielectric material)
- AlSb (low dielectric material)
- Transparent Heat Sink
- Multiple Quantum Well Material
- Metal

OPTICAL PUMPING INJECTION CAVITY FOR OPTICALLY PUMPED DEVICES

The present application claims the benefit of the priority filing date of provisional patent application No. 60/195,193, filed Apr. 7, 2000.

BACKGROUND OF THE INVENTION

1. Field of the Invention

This invention relates to devices which receive light by optically pumping, and more specifically, to optically pumped laser devices.

2. Description of the Related Art

Optically pumped semiconductor lasers that emit radiation at wavelengths greater than $3 \times 10-6$ meters (3 m) are needed for a variety of applications, including chemical sensing, environmental monitoring, and infrared countermeasures. Currently, lasers in this spectral region are inefficient, and high power operation generally requires cryogenic cooling. Operation of these lasers at higher temperatures which would allow the use of thermoelectric cooling rather then cryogenic cooling systems is especially desirable. To date, the only III–V mid-infrared (IR) laser class, either interband or intersubband, to have achieved continuous wave lasing at temperatures greater than 210 K is the optically pumped type II "W" structure. By using a diamond-pressure-bond (DPB) technique, near room temperature (290 K) continuous wave (cw) operation has been obtained for a "W" laser emitting at =3 m, according to "High-Temperature Continuous Wave 3–6.1 m "W" Lasers with Diamond-Pressure-Bond Heat Sinking", by W. W. Bewley, C. L. Felix, I. Vurgaftman, D. W. Stokes, E. A. Aifer, L. J. Olafsen, and J. R. Meyers, Applied Physics Letters 74 (8), 1075 (1999). However, at T=180K the continuous wave maximum power Pmax was approximately equal to 40 mW per facet, and decreased rapidly beyond that temperature due to poor efficiency caused by strong intervalence absorption. It is clear that internal losses and thresholds need to be reduced and efficiencies increased if there are to be any large additional enhancements of the continuous wave output powers at either low or high temperatures, since diamond pressure bond mounting has already improved the thermal management to the point where it represents a secondary rather than primary performance limitation.

Optically pumped type II mid-IR (3–5 $\mu$m) semiconductor lasers are usually pumped by a diode or solid state laser with a pump wavelength in the approximate range of 1–2.5 $\mu$m. Typical pump sources are a Nd:YAG laser or InGaAsSb/AlGaAsSb diode lasers.

Most optically pumped semiconductor lasers consist of an active region that produces the optical gain at the lasing wavelength, which is surrounded top and bottom by an optical cladding material, and grown on a substrate such as GaSb. The pump radiation can be incident either from the top or from the bottom (through the substrate). For incidence from the top, some fraction of the incident radiation is absorbed on its first pass through the active region. However, the remainder is transmitted to the substrate, after which some fraction of the transmitted portion may be reflected back through the optical cladding and into the active region for a second pass.

Many high power cw and quasi-cw optically pumped mid-IR lasers have tried using a short pump wavelength $\lambda_p$ (e.g. of approximately 1 $\mu$m), because of its large absorption coefficient in the active region. In combination with a thick active region [e.g. 50–100 quantum wells or a thick double heterostructure (DHS) region] over 80% of the pump beam can be absorbed in the active layer. A disadvantage of short wavelength pumping is that the large photon decrement (e.g. 3–5:1 in typical mid-IR lasers) limits the maximum efficiency and causes most of the absorbed radiation to be converted into heat. Moreover, free carrier absorption losses, which can significantly degrade laser efficiency, are roughly proportional to the total number of carriers present in the cavity, which are typically high for a thick active region. These losses may be reduced by employing fewer quantum wells or a thinner DHS active region, a trade-off that leads to a weakening of the pump-beam absorbance, so that lower rather than higher efficiencies generally result.

Another approach has been to pump high power cw and quasi-cw optically pumped lasers at a longer pump wavelength, e.g. 1.8–2 $\mu$m, which has several advantages. Use of the longer pump wavelength improves the photon decrement, and therefore, increases the theoretical limit to the efficiency. Because the substrate, for the example of mid-IR lasers, is typically GaSb, and GaSb is transparent to 1.8–2 $\mu$m radiation, better heat removal is possible by mounting the laser epilayer-side-down (where the pump beam is incident on the GaSb substrate). The lower photon decrement and the lower absorption in the substrate typically allow operation of a 1.8–2 $\mu$m pumped laser at a higher temperature than a 1 $\mu$m pumped mid-IR laser.

The drawback of pumping a mid-IR laser at 1.8–2 $\mu$m is that absorption of the longer wavelength pump beam is considerably weaker, so that typically only 10–20% will be absorbed in a single pass through the active region. While a second pass through the active region can follow reflection from a metallization layer or heat sink, it is still difficult to absorb more than 15–35% of the pump beam.

Another approach that has been tried in the mid-IR to improve on the weak pump-beam absorption at $\lambda_p$=1.8–2 $\mu$m is to add more quantum wells to the active region. However, this strategy can become self defeating, as it leads to increased internal losses at high temperatures. Additionally, more heat is generated within the active region and the thermal resistance to heat extraction significantly increases. In fact, less than ten quantum wells would be optimal from a thermal management standpoint. Devices pumped at 1.8–2 $\mu$m can also be grown with extra regions surrounding the quantum wells to absorb more of the pump radiation and allow the generated electron hole pairs to diffuse into the quantum wells. This integrated absorber strategy is limited by weaker absorption in these extra regions than in the active region. While to date, it has had some success, it entails the difficult growth of quaternary regions or short periods superlattices with poor thermal transport properties. Additional carrier confinement issues related to potentially inadequate valence band offset can also arise. It should be noted that the present invention is fully compatible with the integrated absorber approach, so that a combination of the two may be advantageous for some applications.

Ideally, a mid-IR optically pumped laser would combine a high pump absorbance with long pump wavelength and a thin active layer. An optical pumping injection cavity (OPIC) approach, employing a Fabry Perot etalon cavity tuned to the pump wavelength, can provide all three of these features.

SUMMARY OF THE INVENTION

It is an object of the invention to improve the efficiency of lasers that are optically pumped by a narrow bandwidth source that is incompletely absorbed by a single or double pass through the laser active region.

It is an object of the invention to improve the absorption of the pump energy in the active region of an optically pumped laser.

It is an object of the invention to lower the threshold pump intensity of an optically pumped laser.

It is another object of the invention to reduce the amount of cooling needed to operate a high power optically pumped laser.

It is another object of the invention to increase the temperature at which a high power optically pumped laser can operate.

It is another object of the invention to provide low cost, high power, optically pumped edge emitting and surface emitting lasers which can be operated at elevated temperatures or power levels.

It is an object of the invention to provide high power optically pumped semiconductor lasers with high pump absorbance, long pump wavelength, and a thin active layer.

It is another object of the invention to provide lasers with a small number of quantum wells in the active region optimized for pumping at a longer wavelength with high absorption of the pump energy.

The advantages of the OPIC approach have been demonstrated to be especially advantageous in mid-IR (3–5 µm) semiconductor lasers fabricated on GaSb substrates. However, the approach is quite general to other substrates, active layers, and emission wavelengths. It may also be advantageous when applied to optically-pumped lasers whose active regions are not semiconductors.

It is another object of the invention to provide an optical device which can efficiently convert pump radiation to absorbed energy in an optical gain medium, through multiple passes of the pump radiation through the active region.

In accordance with these and other objects made apparent herein, the invention concerns an apparatus for receiving optical pump radiation having a wavelength $\lambda_p$ and transmitting pump light to an active region. The apparatus includes a first and second reflector, each reflector being reflective at the wavelength $\lambda_p$, disposed on opposite sides of the active region, where the separation between the reflectors creates a cavity that is resonant at the pump wavelength $\lambda_p$. The distance is preferably about $m\lambda_p/2n \cos \theta$, where n is the average index of refraction of the material having an active region, θ is the angle that the pump beam transverses relative the normal of said reflectors, and m is any positive integer. In some configurations of the invention, some or all of the active gain medium may be contained within the first and/or second reflector, in which case m may have the value zero in addition to all positive integers.

These and other objects, features, and advantages of the invention will become better understood by reference to the following detailed description.

DETAILED DESCRIPTION

An optically pumped injection cavity (OPIC) laser, which employs a Fabry-Pérot etalon to significantly enhance the absorption of the pump beam, may take several forms. In an edge emitting laser, lasing at the emission wavelength $\lambda_{out}$ is in the plane of the active region. In a surface emitting laser, lasing at the emission wavelength $\lambda_{out}$ is perpendicular to the plane of the active region. In either an edge-emitting or surface-emitting laser, the pump beam may be incident from the epilayer-side or incident through the substrate. Standard terminology for semiconductor lasers describes them as epilayer-side-up if the heat sink is in contact with the substrate, and epilayer-side-down if the heat sink is in contact with the epilayer. Optical pumping can be incident from either the epilayer side or the substrate side for either epilayer-side-up or epilayer-side-down mounting, with the use of appropriate heat sink materials and mounting techniques.

It will be clear to one of ordinary skill in the art that although this description explains the invention in terms of a semiconductor laser, the invention may be equally performed using other types of lasers.

Figure 1:
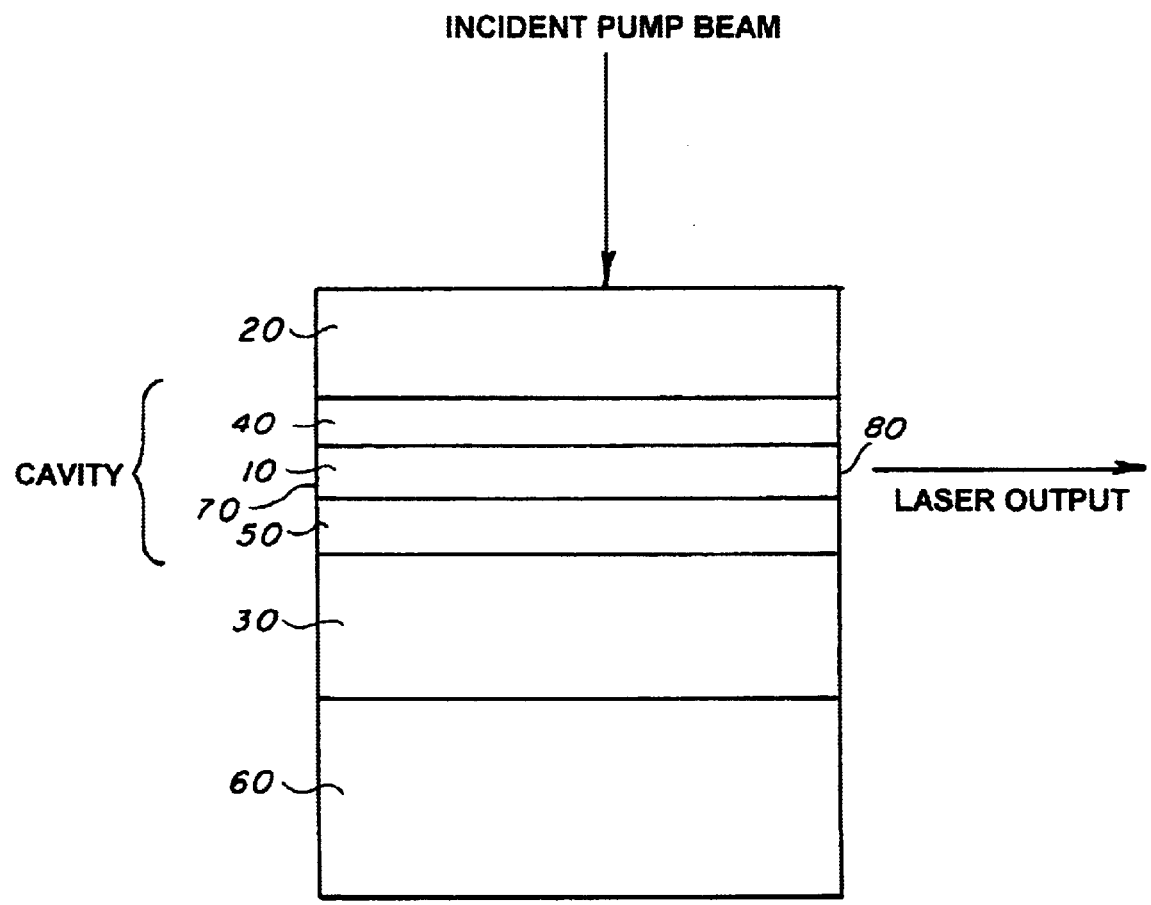
FIG. 1 is a schematic of an OPIC edge-emitting laser.

FIG. 1 illustrates the principles of an OPIC edge-emitting laser. An OPIC, or etalon cavity, consists of an active region 10, and two reflectors, 20 and 30, which are on either side of the active region. A Fabry-Perot etalon will be resonant at a wavelength λ if the distance between the inner surfaces of the mirrors is given by the following formula:

$$nd = m\lambda/2 \cos \theta \qquad \text{Equation (1)}$$

where d is the distance between the reflectors, λ is the wavelength, n is the average index of refraction of the material between the mirrors, θ is the angle that the pump beam transverses relative the normal of the mirrors, and m is any integer (e.g., m=0, 1, 2, 3 . . . ). The special case m=0 corresponds to a phase shift of the resonant optical mode with no additional material contained between the top and bottom reflectors. The optical thickness of the cavity is defined as the product of the average refractive index and the thickness, or nd. In order to take full advantage of the Fabry-Perot geometry and achieve resonance at the pump wavelength, the distance between the inner surfaces of the OPIC mirrors should be designed to satisfy equation (1). Resonance at the pump wavelength $\lambda_p$ results in multiple passes of the pump beam through the active region, ensuring high absorption of the incident radiation in the active region, rather than in another part of the laser device. Should exact control over the distance between the mirrors be difficult to achieve, resonance can be attained by varying either the wavelength or the incident angle of the pump radiation. The resonant wavelength may be varied, for example, by tuning the temperature of the device, either directly through variation of the heat sink temperature or indirectly through variation of the optical pumping intensity.

According to the Fabry-Perot effect, the strongly reflecting reflectors cause constructive interference of the narrow bandwidth pump beam between the two reflectors, greatly amplifying the free-space energy density of the electric field in the cavity with respect to the field outside. Thus, although only a moderate fraction of the pump energy may be absorbed in a single pass through the thin active region, the total absorption of this optically pumped injection cavity (OPIC) configuration can be close to unity. The total absorption, of course, depends on the single pass absorptance and how well the reflector reflectivities are optimized. Multiple passes through the active region also allow the use of a thinner active region, which avoids the drawbacks inherent in a thicker active region such as high internal loss.

For optimal performance, the active region 10 should be positioned at a point of maximum field intensity, as discussed below. Spacers, 40 and 50, between the active region 10 and the reflectors 20 and 30 may be used to maintain separation of the reflectors at the required distance and to locate the active region or regions at the point of maximum field intensity. Either a single active region may be employed, or multiple active region may be separated by multiple spacer layers.

The layers of a semiconductor device are grown, typically through molecular beam epitaxy (MBE) or metalorganic chemical vapor deposition (MOCVD), on a substrate, 60. The deposited layers are collectively called the epilayer. One of the reflectors is typically adjacent to the substrate, 60. The substrate is usually made of a III–V material, such as GaSb, although other materials may be used, as discussed in a following section. The etalon cavity of the OPIC is designed to resonate at the wavelength of the incident radiation, $\lambda_p$.

Figure 2:
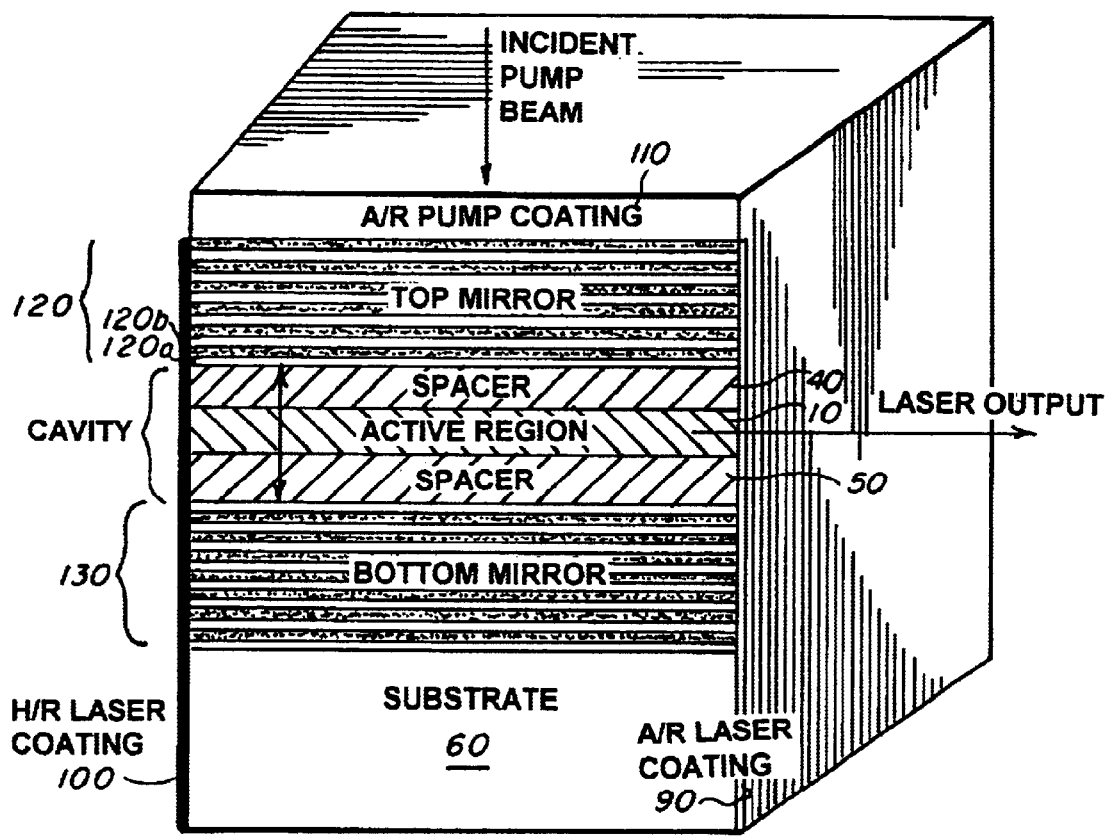
FIG. 2 is a schematic of an OPIC edge-emitting laser which uses distributed Bragg reflectors.

In an edge emitting laser, the waveguide greatly influences the operating properties by shaping the mode of the emitted radiation transverse to the direction of the axis of the laser cavity (the laser cavity is along the x-direction in FIG. 2). In traditionally configured edge emitting lasers, the active region is typically surrounded by a region of lower refractive index material (optical cladding) which confines the lasing mode close to the active region, increasing its intensity in the area close to the active region. Adequate confinement of the optical mode along the growth axis (the y axis in FIG. 2) by the lower refractive index material is needed to reduce the optical loss associated with escape of the mode into regions outside of the vertical waveguide. For the other axis in the plane of the epilayer (the z-axis in FIG. 2) that is traverse to the laser cavity, the waveguide mode in this direction may be defined by the presence of gain, e.g., determined by the spatial extent of the pumping area or by refractive index guiding. As is well known in the art, index guiding may be accomplished, e.g. by etching a mesa or otherwise varying the modal refractive index along the z axis so as te controllably define the widths of the laser stripe.

For edge-emitting OPIC lasers, the spacer layers 40 and 50 preferably comprise material or materials with a higher index of refraction than the reflectors, in order to increase the modal refractive index and better confine the lasing mode close to the active region. However, spacer layers with a lower index of refraction than the reflectors may also be employed as long as the net modal index of the lasing mode is larger than the net index of the top and bottom optical cladding layers, each of which may comprise the mirror layer alone or the mirror layer combined with additional lower-index optical cladding layers. In some configurations, one or both reflectors may be contained entirely within the higher-index waveguide core, and mode confinement is due entirely to additional low-index optical cladding layers located outside of the reflector layers.

For edge emitting lasers, parallel facets, 70 and 80, obtained by cleaving or etching typically define the laser cavity. The facets themselves act as reflectors to form the laser cavity, or resonator. The length of the laser cavity is shown as L (along the x-axis in FIG. 2). Reflectances of uncoated cleaved facets are typically about 30%, and can be varied from almost zero to nearly 100% by the use of appropriate coatings. An OPIC laser may have either coated or uncoated facets.

Distributed Bragg reflectors (DBR) may be used as the top and bottom reflectors of the Fabry-Pérot etalon. Other types of structures that are reflective at the wavelength of the pump radiation may be used, as will be apparent to those skilled in the art. One example is a metal surface. FIG. 2 illustrates the use of DBRs to surround the active region of an edge emitting OPIC laser.

Both distributed Bragg reflectors, 120 and 130, are composed of alternating layers of material with different refractive indices. An example of a material with a high refractive index useful for DBRs is GaSb. An example of material with a low refractive index useful for DBRs AlAs$_{0.08}$Sb$_{0.92}$, which has the same lattice constant as GaSb and can therefore, be grown with high structural quality on a GaSb substrate. In the top DBR, 120, the first layer, 120a, is usually a high refractive index material, which requires that the next layer, 120b, be a low refractive index material. Layers of high and low refractive index continue to alternate. On the opposite side of the OPIC in FIG. 2 is a bottom distributed Bragg reflector, 130. It is preferable to use alternating semiconductor layers in both the top and bottom DBRs. However, another possibility is that one of the DBR comprise alternating higher-index and lower-index dielectric layers that are deposited on top of the semiconductor structure after growth of the semiconductor epilayer. A further possibility is to deposit a dielectric mirror, remove the semiconductor from the substrate, and then use a dielectric mirror on the opposite side. A further possibility is that the active gain medium not be a semiconductor at all, but rather a gas, liquid, or solid state gain medium known to provide favorable lasing properties, and then fabricate DBRs on both sides of the gain medium by a convenient fabrication means. The advantages of this non-semiconductor OPIC would be similar to those of the semiconductor OPIC, namely high absorptance of the pump beam in conjunction with a gain medium that is thin or weakly absorbing. As discussed above, the DBRs function to enhance absorption of the pump beam by reflecting the pump beam through multiple passes of the active region.

Thicknesses of the spacer 40 and 50, as discussed above, are adjusted so as to insure that the thickness of the OPIC cavity satisfies Equation (1). The configuration of the laser illustrated in FIG. 2 is epilayer-side-up, wherein the pump beam is incident from the top, and the GaSb substrate 60 is opposite the incident pump beam.

Highly reflective coating 100 and low reflectivity coating 90 may be optionally added to the laser facets to improve the laser efficiency. A coating which is anti-reflective at the pump wavelength 110 may also be added to the top reflector, to optimize the net pumy absorptance.

The following examples are optically pumped lasers constructed from materials in the antimonide family of semiconductors, which includes GaSb, AlSb, InAs, GaInSb, AlAsSb, and other ternary and higher order mixes of these materials with lattice constants near 6.1 Å. The particular designs which follow are optimized for a pump wavelength of 2.17 µm, but can be modified to any value using generalizations that will be obvious to those skilled in the art. Similarly, optically pumped injection cavity lasers may be manufactured with materials from other semiconductor families.

Optically Pumped Injection Cavity (OPIC) Edge-Emitting Lasers

In order for lasing action to take place, the lasing mode must be confined within a waveguide, close to the active region. In traditional optically pumped lasers, layers of optical cladding material whose index of refraction is lower than that of the active region, surround the active region and confine the lasing mode in close proximity. Sometimes a separate confinement heterostructure (SCH) layer, with a higher refractive index than the cladding layer is incorporated near the active region in order to improve the optical confinement of the lasing mode in case the active region is too thin to provide good confinement by itself.

In an OPIC laser, spacers 40 and 50 with sufficiently high refractive indices can act as SCH layers. The average refractive index of a DBR reflector may be estimated as the weighted average of its constituent layers, where the index of each layer is weighted by its thickness. If the average refractive index of each DBR reflector is lower than the average index of the active and spacer layers, additional optical cladding may be unnecessary. The refractive index of the spacers serves to confine the laser mode in close proximity to the active region, so that the DBR having a smaller average refractive index than the spacer may effectively function as an optical cladding. GaSb is an example of a material with a high refractive index from which effective spacers which also function as SCH regions for mid-IR lasers may be grown.

Although it is advantageous to use a high-index material such as GaSb for spacers, eliminating or reducing the need for additional cladding layers above and below the DBRs, it is not necessary to the operation of an OPIC laser. Instead, separate layers of optical cladding added on either side of the spacers or beyond the reflector may be used to confine the lasing mode.

Configurations are also possible in which the average refractive index of some portion of the DBR reflectors is relatively high, in which case that portion of the DBR functions as an additional SCH layer.

If high index spacers are used, and if the average index of refraction of the DBR is less than that of the active region combined with the spacers, then the DBRs have two functions: as optical cladding for the laser waveguide, and as components of the Fabry-Pérot etalon cavity, reflecting the pump energy through the active region.

Figure 3:
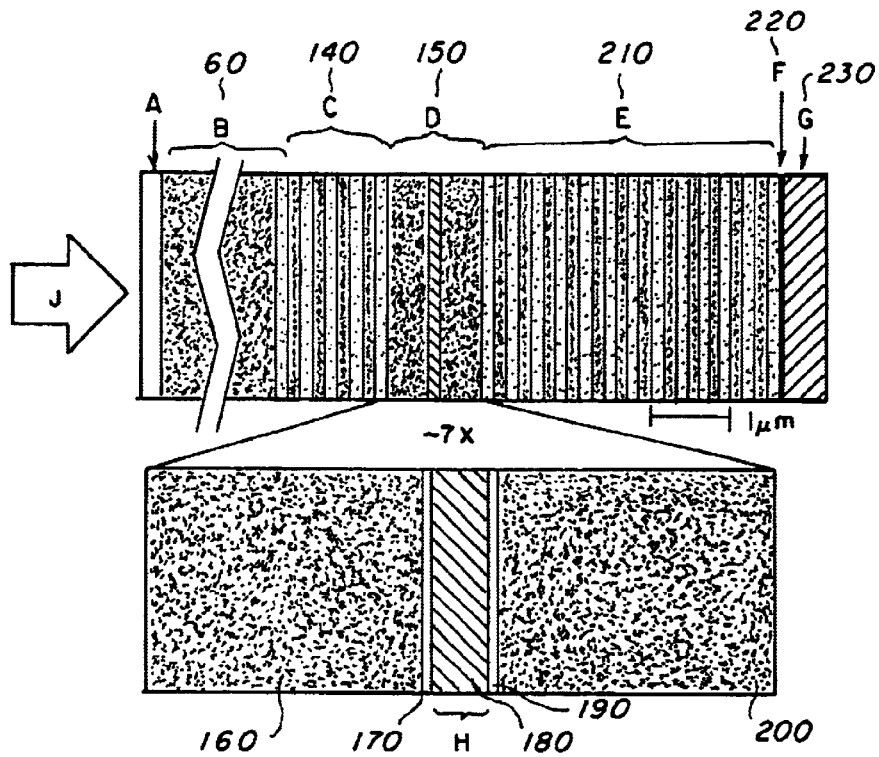
FIG. 3 is a schematic of a specific OPIC edge-emitting laser design, in the epilayer-side-down configuration with an expanded view of the OPIC design to include the spacers, the thin AlAsSb layers, and the "W" active region composed of multiple quantum well material.

FIG. 3 illustrates an example of an OPIC laser, in which the device is mounted epilayer-side-down on a heat sink. The fabrication procedure starts with a substrate 60, which is typically GaSb, approximately 500 µm in thickness. However, many other substrate, active-region and DBR material combinations are possible, the optimum choice of which depends on desired lasing wavelength as well as a number of other considerations. Notice that in this epilayer-side-down configuration, the pump radiation is incident on the substrate, shown on the left in FIG. 3. On top of the substrate a DBR 140 of alternating $AlAs_{0.08}Sb_{0.92}$ and GaSb layers is grown first, in which the composition of the ternary layer is chosen to match the lattice constant of the substrate material. This DBR 140 is a 4½ period DBR, having 9 alternating layers. Next, the central cavity of the OPIC 150 is grown. This compound structure consists of a thick GaSb spacer 160, a thin $AlAs_{0.08}Sb_{0.92}$ layer 170 to block the escape of holes from the active region, a "W" multiple-quantum-well active region 180, another thin $AlAs_{0.08}Sb_{0.92}$ layer 190 (again to block the escapes of holes from the active region), a second GaSb spacer 200, and finally a top 12½ period DBR layer 210. The thicknesses of the layers comprising the etalon cavity are symmetric about the center of the active region, and the total optical thickness is equal to twice the pump wavelength ($2\lambda_p$). However, it is not necessary that the OPIC layers be symmetric about the center of the active region. The number of layers in these DBRs is initially calculated as optimum for the particular wavelength and assumed strength of absorption for the materials and geometry. The optimum number will differ based on the indices of refraction for the materials used, the absorption at the pump wavelength of the active region, and the desired peak absorptance. Methods to optimize these quantities should be familiar to those versed in the art. The numbers of periods in the DBRs also governs the spectral and angular width of the etalon resonance. Mirrors with a large number of layers and therefore a high reflectivity form an optical cavity with a high Q, which leads to more effective passes of the pumy beam through the active region. The result is that there is a higher absorptance for a very thin active region, but a potential disadvantage is that the resonance is very narrow. A narrow resonance may be suitable for some pump configurations, but not when the pump wavelength has an appreciable spectral width or when there is a range of incident angles. In the opposite limit of a small number of periods in the DBRs and therefore a lower mirror reflectivity and lower-Q cavity, the enhancement of the absorptance is smaller but absorption is obtained for wider range of pump wavelengths and incident angles of the pump beam.

Note that the use of the thin $AlAs_{0.08}Sb_{0.92}$ layers to block the escape of holes from the active region is optimal for these materials, but is not essential, and may not be necessary for other materials. In this example, the spacer thickness is selected to accomplish both the function of insuring the OPIC is a half-integral number of pump wavelengths and to act as SCH layers which allow the DBRs to by themselves provide an adequate optical cladding for confinement of the lasing mode.

The longer DBR 210 has 25 alternating layers of high and low refractive index material (a 12½ period DBR). In this example, the final layer is modified to support the addition of an optional 150 Å GaSb cap layer to prevent oxidation of the aluminum rich AlAsSb compound below.

After growth of the semiconductor layers described above, additional processing is useful to optimize the laser's operation. An additional layer 220 may be deposited in order to attach a heat sink to the device. Optimally, this additional layer 220 is a highly reflective metallic layer which complements the reflective properties of the adjacent DBR, or may even replace the adjacent DBR, and may be used to attach the device to a heat sink 230, for example using a die bonding process.

Optionally, the substrate may also be thinned to reduce possible free-carrier absorption of the pump laser and to aid the cleaving, then polished, after which an anti-reflection coating may be deposited. This anti-reflection coating increases the fraction of pump energy that enters the OPIC, and hence the efficiency of the laser.

Figure 4:
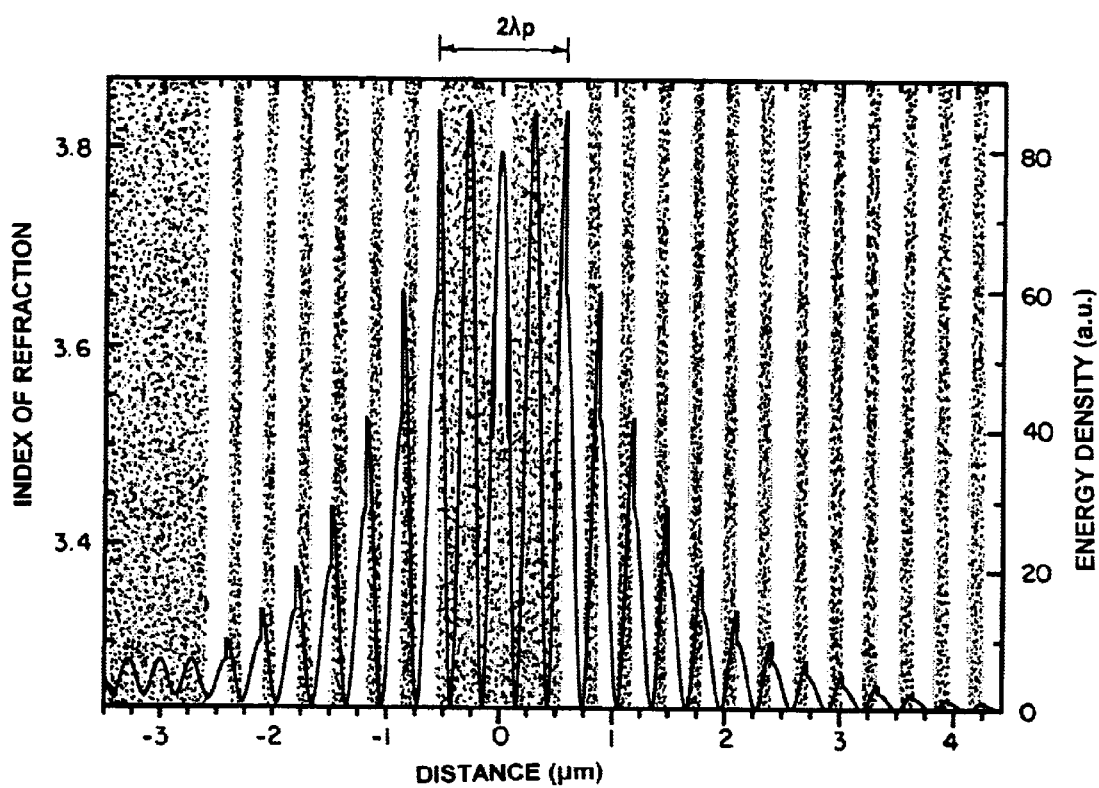
FIG. 4 shows the energy density of the pump radiation within an OPIC epilayer-side-down laser that is pumped at a design wavelength of 2.17 µm, corresponding to the laser design shown in FIG. 3.

FIG. 4 shows the calculated energy density of the pump radiation within an OPIC epilayer-side-down laser that is pumped at a design wavelength of 2.17 μm, such as the laser shown in FIG. 3. The alternating darker areas are the high-index (GaSb) material of the distributed Bragg reflectors. The dark area to the left of the profile at about −3 μm from the center corresponds to the GaSb substrate. The thin hole-blocking layer of $AlAs_{0.08}Sb_{0.92}$ does not appear, due to the scale of the figure. The center white area at 0 corresponds to the active region, and the surrounding darker regions correspond to the GaSb spacers, with a total optical thickness for the cavity of $2\lambda_p$ (just over 1 μm wide). The solid curve indicates the density of the pump energy at different locations in the laser. Note that the energy density in the active region is nearly eighty times greater than the average value outside the structure.

Because the optically pumped injection cavity has both maxima and minima of the incident pump radiation, placement of the active active region is important to optimize the efficiency of the device. FIG. 4 shows three peaks of the pump energy within the $2\lambda_p$ cavity. If the optical thickness of the active region begins to approach $\frac{1}{4}\lambda_p$, a greater coupling efficiency may be realized by splitting the active region into two or more thinner layers, and placing them at different pump maxima within the cavity.

It is also worth noting that it is not necessary for the OPIC to have inversion symmetry. It can be asymmetric, and the position of the active region material optimized accordingly.

A different heat-sinking technique may also be used. For example, excellent results have been obtained for optically pumped semiconductor lasers that are not attached to a heat sink using metallic bonding (such as soldering), but are simply pressed against a transparent material with excellent thermal conductivity, such as diamond. This technique is referred to as diamond-pressure-bonding (DPB), and it affords the possibility of pumping through the heat sink material, which in turn allows the use of pump lasers that would be strongly absorbed by the substrate material. This technique is detailed in U.S. patent application Ser. No. 09/492,068 (Docket NC 79,791, filed on Jan. 27, 2000 for inventors Bewley, Aifer, Vurgaftman, Felix, Meyer). An advantage of using a diamond-pressure-bonding technique is that it allows use of the epilayer-side-down configuration, in which the pump beam is incident through the transparent diamond heat sink, and which has better heat transfer properties than an epilayer-side-up configuration.

As an alternative, an epilayer-side-up configuration laser may be made by die bonding the heat sink material to the substrate.

Figure 5:
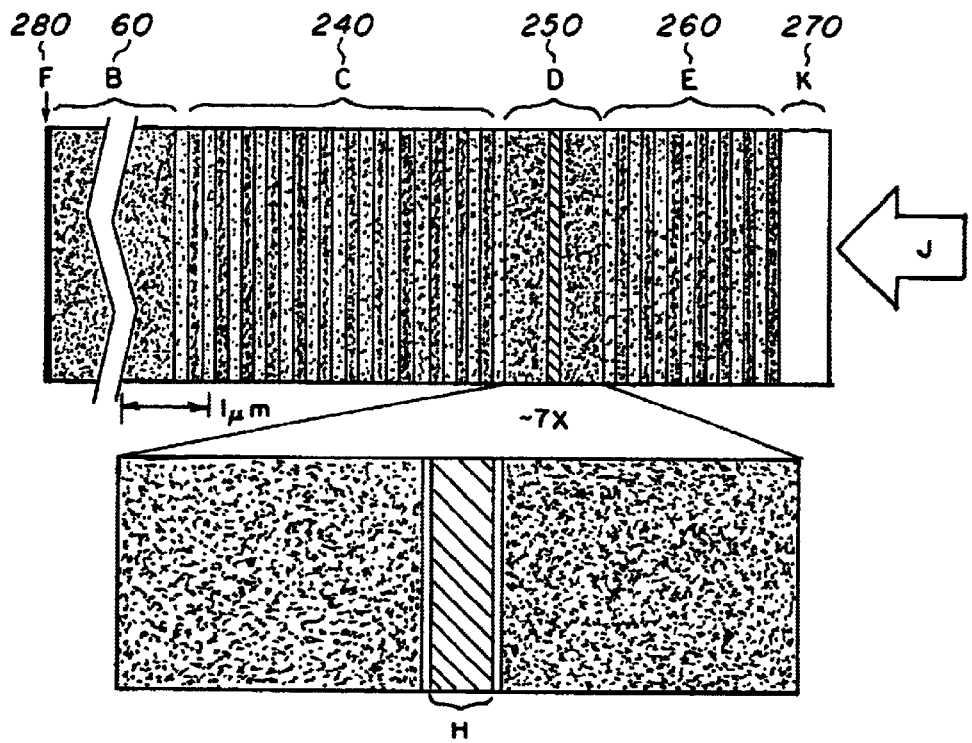
FIG. 5 shows a detailed schematic of a specific optically pumped laser design, in the epilayer-side-down configuration, with a diamond pressure bonded heat sink.

FIG. 5 shows a detailed schematic of an optically pumped laser with a DPB-OPIC, pumped from the right. Again, fabrication starts with an approximately 500 μm thick GaSb substrate. On top of the substrate 60, a bottom DBR 240 of alternating $AlAs_{0.08}Sb_{0.92}$ and GaSb layers is grown, where each layer has a thickness of $\frac{1}{4}\lambda_p$. Next, the central cavity of the OPIC 250 is grown, in an identical manner as for the OPIC 150 of the epilayer-side-down laser of FIG. 3. The growth is finished with a shorter top DBR 260, here shown as 7½ periods, again with ¼ $\lambda_p$ thick alternating layers of $AlAs_{0.08}Sb_{0.92}$ and GaSb. The transparent heat sink layer 270 is the diamond of the pressure bond DBP 260. The substrate 60 may be thinned to facilitate the cleaving of parallel facets, and the back layer of the substrate may be metalized 280, although this is not necessary for operation of the device. Again, the number of periods in the DBR structures is optimal for the assumed material properties as well as the properties of the pumy beam, and may be adjusted for the particular material properties and desired device characteristics.

For both the epilayer-side-up and the epilayer-side-down OPIC configurations discussed above, the number of periods in the thicker (bottom) DBR was chosen to give almost complete reflectivity. Because many metals are somewhat lossy at infrared wavelengths, it is desirable to shield them from the pump laser by careful selection of the number of periods in the bottom DBR. If the pump energy were not shielded from the metallic layer, the pump energy would reflect off the metallic layer many times during the operation of the device, significantly reducing the conversion efficiency of the device.

In both the epilayer-side-up and the epilayer-side-down OPIC configurations, the number of periods in the thinner (top) DBR is chosen to optimize the absorption of the pump beam in the active region of the device. Depending on the boundary conditions of the OPIC (what materials surround it on either side) the number of periods in each DBR must be optimized for the particular operating conditions. The maximum absorption of incident energy for a Fabry-Pérot cavity filled with an absorbing material occurs when the sum of the reflectance of the top reflector and the double pass absorbance of the inter-cavity material equals the reflectance of the second reflector, as discussed in "Molecular Beam Epitaxy Engineered III–V Semiconductor Structures for Low-power Optically Addressed Spatial Light Modulators", A. G. Larson and J. Maserjian, *Optical Engineering* 31(7), 1576 (1992). However, in an OPIC, the optimal design placement of the active region is not spaced evenly throughout the cavity, but concentrated at the anti-nodes of the internal field. This modifies the optimal reflectance of the incident DBR stack relative to the secondary in comparison to an OPIC cavity completely filled with absorbing material. The calculations necessary to optimize the design of OPIC structures for particular materials and operating conditions should be accessible for those versed in the state of the art.

Figure 6:
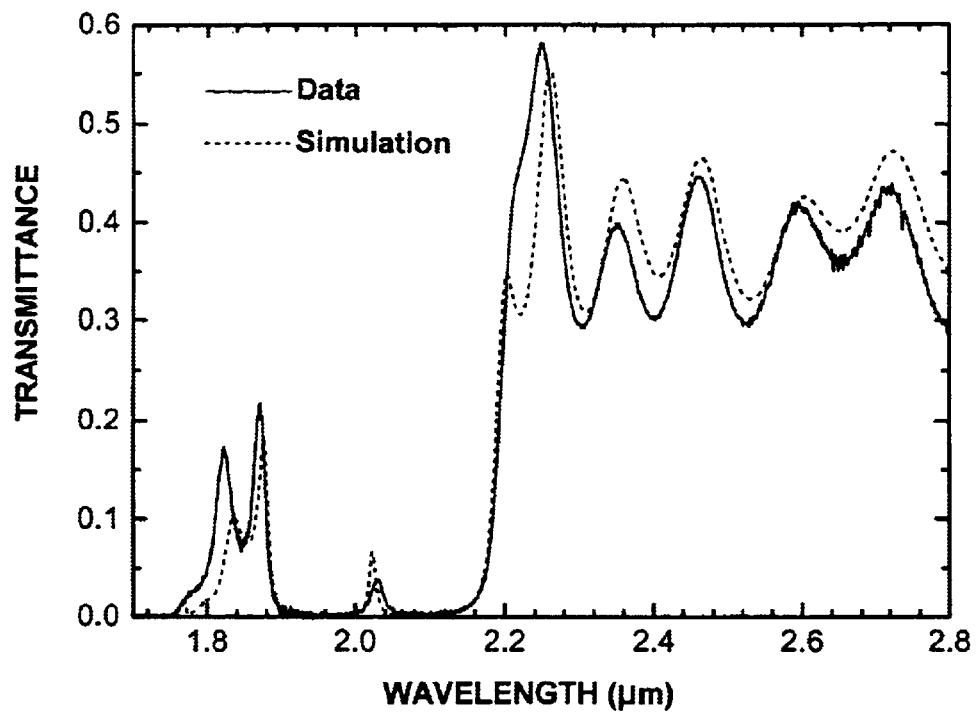
FIG. 6 illustrates the measured and simulated transmittance of an edge-emitting OPIC structure that was designed for pumping around 2 µm and emission in the 3–4 µm range.

An effective method for determining the resonant wavelength of the OPIC pump cavity is to measure the transmission spectrum. As an example, for an edge-emitting OPIC, one obtains a broad minimum in the transmittance, which corresponds to the DBR reflector plateaus, and a small peak somewhere within the broad minimum, which corresponds to the resonant wavelength of the cavity. This means of unambiguously determining the resonant wavelength (at the given incident angle of the transmission measurement) provides a valuable diagnostic tool for optimizing the device and assuring that the resonance is at the appropriate wavelength. FIG. 6 illustrates the measured and simulated transmittance of an edge-emitting OPIC structure. The central plateau of the stack is from 1.84 to 2.18 μm, corresponding to the low transmission area of the transmittance spectrum. The cavity absorption is centered at a wavelength of approximately 2.03 μm.

When the OPIC cavity is grown, if the thickness of the layers is not exactly as designed, one can decide, based on the measured transmission spectrum, whether wavelength or angle tuning may be used to achieve resonance with the pump wavelength, where the relationship between the pump angle, pump wavelength, and optical thickness of the cavity is as defined as in Equation (1). If not, the structure may be regrown using the required thickness adjustment that may be determined from the transmission spectrum. By scaling the thickness of the layers in the simulation shown in FIG. 6, it was determined that the growth parameters for this sample were approximately 7% less than the nominal design. This information can then be used to recalibrate the growth rate for later production.

Figure 7:
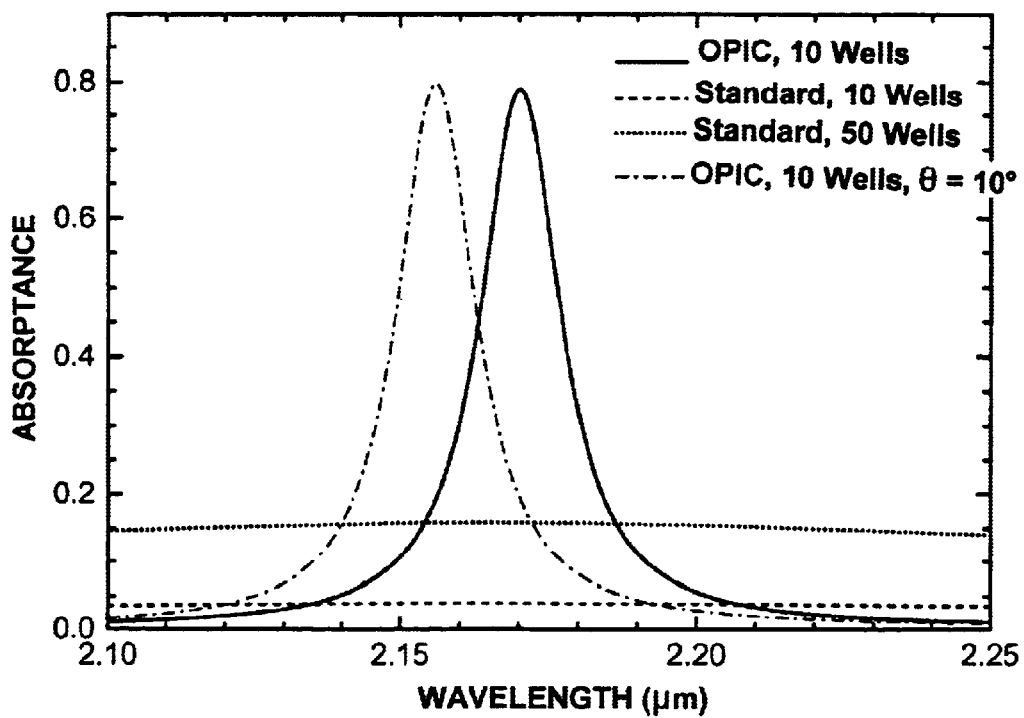
FIG. 7 compares the predicted absorbance of an OPIC laser with the absorbance of a traditionally configured optically pumped laser, for a typical example designed for pumping near 2.15–2.17 µm.

FIG. 7 compares the predicted absorptance of an optically pumped injection cavity laser with the absorptance of a traditionally configured optically pumped laser (with no etalon cavity for the pump beam). The dashed curve is the predicted absorptance of a standard optically pumped laser with 10 quantum wells, and the dotted curve is the predicted absorptance of a standard optically pumped laser with 50 quantum wells. The solid curve is the predicted absorptance of an OPIC with 10 quantum wells. The dash-dotted curve shows the predicted absorptance of a 10-well OPIC laser when the pump beam is incident at ten degrees from the normal, within a transparent diamond heat sink. As the pump beam shifts away from the normal, the wavelength at which the cavity is resonant decreases. This device may be thus be angle tuned by moving either the device or the incident pump beam to achieve resonance between the pump wavelength and the OPIC thickness. It should be noted that if it is necessary to tune beyond the angle within the DBR that can be achieved from an air/dielectric interface, greater internal angles can be achieved by coupling through a high-dielectric prism (i.e. silicon, germanium, diamond, sapphire) into the laser material. Angle tuning may be employed either as the primary tuning mechanism or as a finer tuning mechanism when coupled with wavelength or other tuning methods. Variation of the heat sink temperature may also be used to assure alignment of the pump wavelength and the cavity resonance.

Although an OPIC may be tuned into resonance by varying either the wavelength or angle of the pump radiation, the actual mode of usage must be considered in designing the structure for maximum effectiveness. From a thermal management standpoint alone, the number of quantum wells in the active region 10 should be made as low as possible. Even with a single quantum well it is possible to attain an absorptance approaching 100% with proper design of the cavity mirrors. However, the smaller the single pass absorptance, the narrower the resonance condition becomes, i.e., a smaller range of wavelengths or angles will couple effectively to the device. FIG. 7 shows a fairly narrow range of effective coupling in wavelength for a 10 quantum well device, which would become even narrower if the number of quantum wells were reduced while the peak absorptance value was held constant. In a typical operating configuration for an optically pumped laser, the pump beam is focused by cylindrical optics to a narrow line along the cavity axis. To achieve a narrow focus of the pump beam, which may be optimal for both thermal management and output beam quality, a low f-number, or fast optics must often be used. However, a low f-number system for focusing the pump radiation implies that the radiation is incident over a wide range of angles. For an f/1 optical system, the pump radiation would be incoming from all angles between −26° to +26°, which is equivalent to a ±10% variation in pump wavelength due to the relationship in equation (1). However, a broadened OPIC can be designed that will effectively couple radiation to the active region over this wide a range of angles or wavelengths. This can be most simply done by widening the resonance, by increasing the single pass absorptance (usually by increasing the number of quantum wells) and reducing the reflectance of the first reflector. Design trade-offs of this type between device efficiency and thermal management properties will be familiar to those skilled in the art.

Vertical Cavity Surface Emitting Configuration

Figure 8:
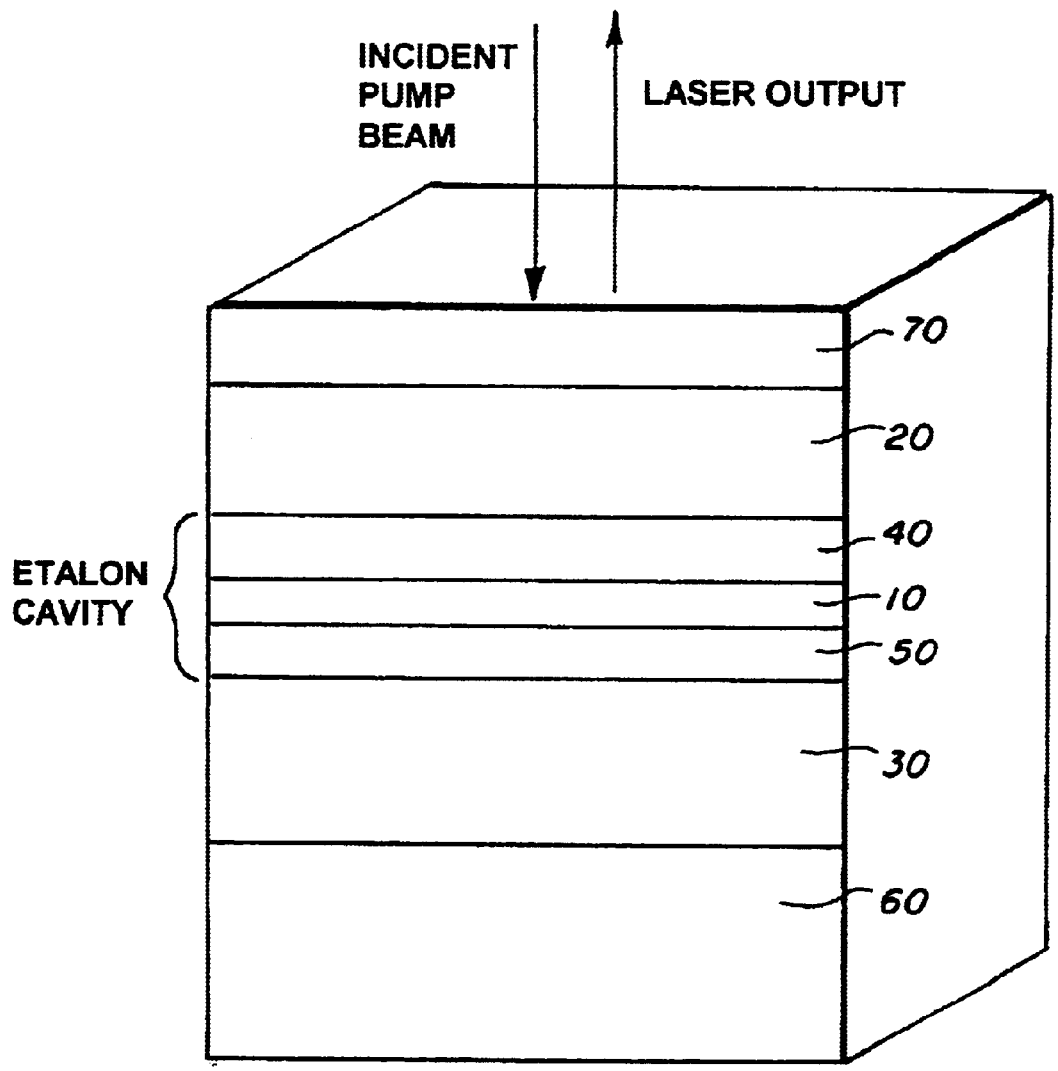
FIG. 8 is a schematic of an optically-pumped injection cavity (OPIC) laser configured as an vertical-cavity surface-emitting laser (VCSEL).

In another embodiment of the invention, an optically-pumped injection cavity (OPIC) laser is configured as a vertical-cavity surface-emitting laser (VCSEL), in which both the optical pumping injection cavity, resonant at the pump wavelength, and the laser cavity, resonant at the laser emission wavelength, are perpendicular to the plane of the epilayer. FIG. 8 schematically illustrates an example. As in the edge emitting configuration, the active region 10, is surrounded by reflectors 20 and 30, and the distance between the inner surfaces of the reflectors is determined by Equation (1).

Most of the principles of the etalon cavity, manufacture, options for epilayer-side-up and epilayer-side-down geometry, and materials relating to the edge emitting OPIC lasers discussed above, are equally applicable to the VCSEL lasers discussed herein, with the exception that the laser cavity is not in the plane of the epilayer, and cleaved facets do not define the laser cavity.

For surface emitting lasers, in which the laser emission is perpendicular to the epilayer, reflectors which are reflective at the laser emission wavelength must be created above and below the active region, as the reflectance of the naturally occurring air/dielectric interfaces is usually not large enough to support lasing in the VCSEL configuration. The reflectors 20 and 30, in addition to reflecting the pump energy, must also act as reflectors at the laser emission wavelength in order to confine the luminescence within the active region until the lasing threshold is reached. The use of reflectors to accomplish both functions is dependent upon the materials chosen and the geometry of the active region, spacers, and reflectors. Reflectors which reflect at the laser emission wavelength may be distributed Bragg reflectors, or another type of reflector, as those skilled in the art will recognize.

In previous traditionally configured VCSELs, the DBRs reflect at the laser emission wavelength, but not at the pump wavelength. Indeed, reflector stacks for traditionally configured VCSELs are typically designed to assure that they will not strongly reflect at the wavelength of the pump radiation. For an example of an optically-pumped VCSEL designed to avoid reflectance at the pump wavelength, see "Vertical-cavity surface-emitting lasers with low ripple optical pump bands", K. J. Knopp, D. H. Christensen, and J. R. Hill, *Applied Physics Letters*, 69 (26), 3987 (1996).

Creation of the reflectors may be accomplished by depositing distributed Bragg reflectors during the laser growth process, or in a separate deposition afterward. DBR structures most commonly use alternating quarter-wavelength thick layers of refractive index material to create a highly reflective structure. The reflectivity of a DBR structure depends upon the number of alternating layers, and the dielectric contrast, or difference in refractive index between the two layers. The greater the contrast between the index of the alternating layers, the fewer the number of layers necessary to achieve a particular reflectance. The length of the laser cavity for such a vertical-cavity surface-emitting laser is much shorter than for an edge emitter (for example, a typical value for the epilayer thickness in a VCSEL is approximately 5 $\mu$m, while the length of the cleaved laser cavity in an OPIC edge-emitter is typically 0.33 mm). Because the epilayer thickness is much less than the length of a typical cleaved cavity, VCSEL reflectors have much higher reflectances, typically greater than about 95%.

The reflectance of the top and bottom DBR should be optimized for both the pump and laser wavelengths. The active region should be placed at a position that is optimal for both pump absorption and coupling of the emission to the lasing cavity mode. The design is relatively straightforward if the pump and laser emission wavelengths are commensurate (i.e., one is a relatively simple fraction of the other, such as ½). If the pump and laser emission wavelengths are not commensurate, more careful design of the OPIC structure is needed. Modeling shows that such designs are practical despite their greater complexity. Tuning to resonance with the pump wavelength may still be accomplished by varying the incident angle of the pump beam.

For confinement of the laser emission in a VCSEL, the spatial extent of the laser mode is defined in both in-plane axes (shown as the x and z axes in FIG. 8) by the extent of the optical pumping. The gain region can also be constrained by the etching of mesas or the creation of other confinement structures.

End-Pumped Solid-State Lasers

Discussions of end-pumped solid-state lasers concern issues nearly identical to those of OPIC-VCSELs, as the exes of the lasing mode and pump-beam are colliner for optimal operation. However, in solid-state lasers the output reflectors are typically physically separated from the active medium crystal. The solid-state crystal typically is anti-reflection coated at the pump wavelength on the input end, and high-reflection coated on the opposite and. Thu, to optimize the distribution of absorbed pump radiation within the crystal, the crystal length and dopant concentration must be well matched. These conditions can be greatly relaxed by using an OPIC configuration, wherein the anti-reflection coating is replaced by a coating of a reflectance suitable to optimize the pump-beam absorptance profile for the actual, rather than the optimal doping profile and cavity length. Since the doping profile and averaage concentration are difficult to control precisely, it may be much simpler to design an appropriately reflectig coating after the fact, once the crystal rod haz been fabmriceted. Solid-state lasers where the output reflectors are not exteranl to the crystal are nearly identical to semiconductor OPIC-VCSELs in their optimization issues, except that the dual reflectivity coating are usually added afterward, and are not part of the original crystal fabrication.

Side-Pumped Solid-State Laser

These lasers are nearly identical in their optimization isues to edge-emitting semiconductor lasers, except that there must be two parallel facets parallel to the cavity axis such that the Fabry-Perot cavity can be realized.

Demonstrated Results

FIGS. 9–12 show demonstrated results for a simeconductor edge-emitting OPIC laser. The OPIC structure was designed so the cavity would have a resonance at 2.17 $\mu$m at room temperature. This value was chosen so that even if the layer thicknesses within the sample were inaccurate by several percent, the resonance could be reached at any temperature by angle tuning, as previously illustrated in FIG. 7.

Figure 9:
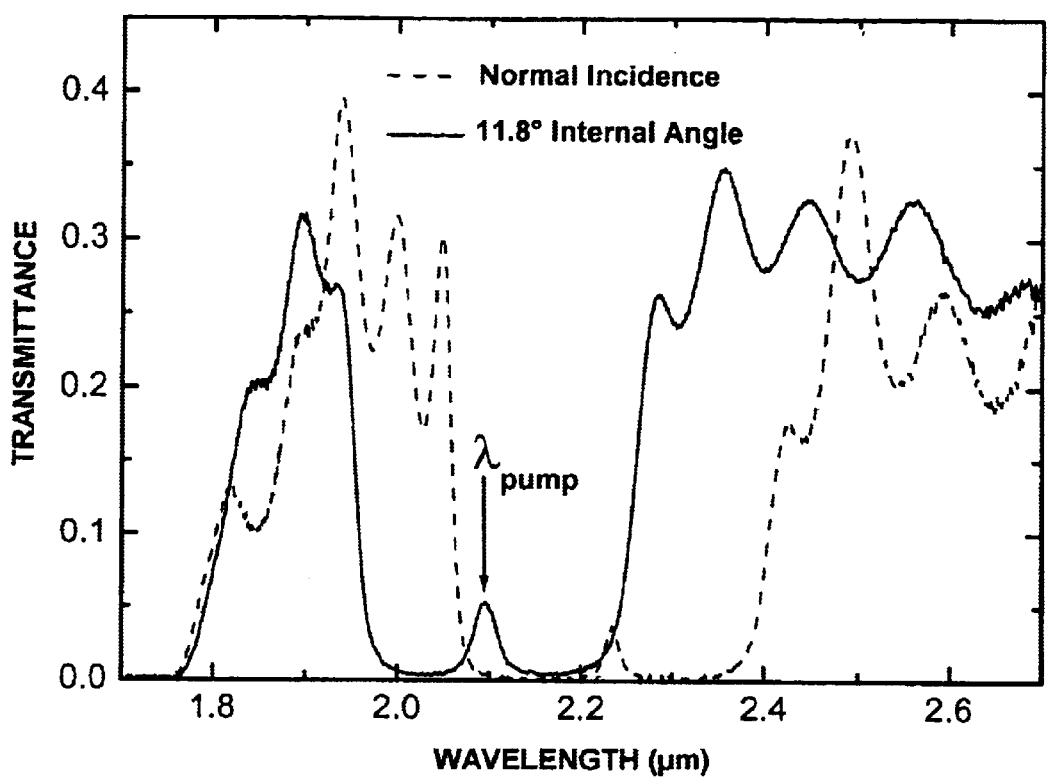
FIG. 9 illustrates the measured room-temperature transmission of an OPIC sample at a normal incidence angle and at an internal angle of 11.8°.

The dotted line in FIG. 9 shows the measured room-temperature transmittance of this sample at normal incidence. The cavity resonance for this sample is actually at $\lambda$=2.23 $\mu$m, corresponding to a 3% mis-calibration of the growth rate. The solid line in FIG. 9 shows the measured transmission of the sample when oriented to achieve an angle of 11.8° (of the pump beam with respect to the sample normal) within the sample. The cavity resonance has clearly moved into coincidence with the pump wavelength at $\lambda_p$=2.098 $\mu$m. Coupling at 11.8° was accomplished using glass prisms at the entrance and exit sides of the sample. FIG. 9 demonstrates that by changing the angle of the pump beam within the OPIC, the cavity resonance can be made coincident with the pump wavelength.

Figure 10:
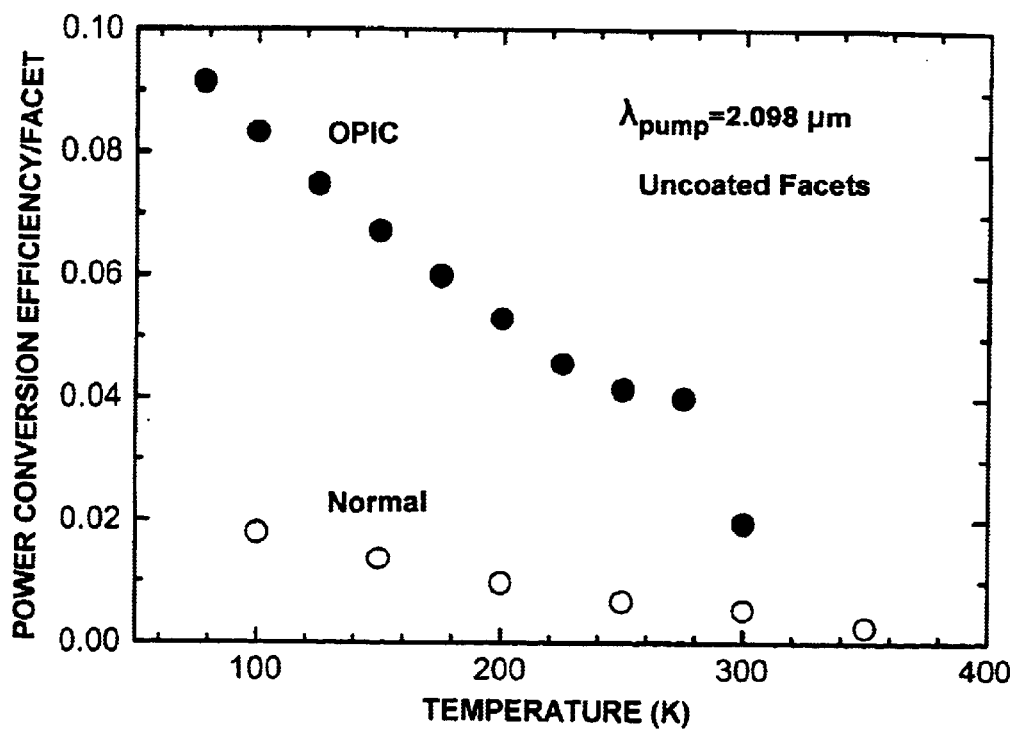
FIG. 10 illustrates the power conversion efficiency per facet as a function of temperature for an edge-emitting OPIC laser and for a standard configuration optically pumped laser.

FIG. 10 illustrates the power conversion efficiency per facet as a function of temperature for an OPIC laser with 10 quantum-wells ($\lambda_{out}$=3.1–3.4 $\mu$m, filled circles) and a for a standard configuration optically pumped laser with 80 quantum wells ($\lambda_{out}$=3.2–3.7 $\mu$m, open circles). Both lasers had uncoated facets and active regions consisting of similar W quantum wells (apart from the number of quantum wells). The OPIC laser was prepared by cleaving the laser cavity to a length of 0.5 mm, and mounting the bars using the diamond pressure bond (DPB) technique, discussed earlier. A glass prism was epoxied to the back side of the diamond heat sink so that a sufficient coupling angle could be obtained with the sample to achieve cavity resonance with the pump wavelength, and the entire apparatus was placed within a cryogenic dewar to control the temperature. The OPIC laser was then optically pumped through the glass prism and diamond heat sink. The pump laser was operated in pulsed mode at a 1 Hz repetition rate with a pulse width of approximately 120 nanoseconds (ns). At temperatures above 100 K, the OPIC results represent the highest reported conversion efficiencies for an optically-pumped semiconductor laser beyond $\lambda_{out}$=3 $\mu$m, as reported in "High-Efficiency Mid-IR "W" Laser with Optical Pumping Injection Cavity (OPIC)" by C. L. Felix, W. W. Bewley, I. Vurgaftman, L. J. Olafsen, D. W. Stokes, J. R. Meyers, and M. J. Yang, *Applied Physics Letters* 75 (19), 2876 (1999). At a temperature of 275 K, the efficiency of 4% is nearly a factor of six greater than any previous result. These results could have been further improved by the application of appropriate coatings on the facets of the laser bars.

One reason for the high efficiencies expected and observed for OPIC lasers is the substantial reduction of free carrier absorption that is obtained when the number of active quantum wells is reduced, especially at higher temperatures. This has been reported in "Optical-Pumping Injection Cavity (OPIC)-Mid-IR W Lasers with High Efficiency and Low Loss", by Bewley et al, IEEE Phot. Tech. Lett. 12, 477 (2000).

Figure 11:
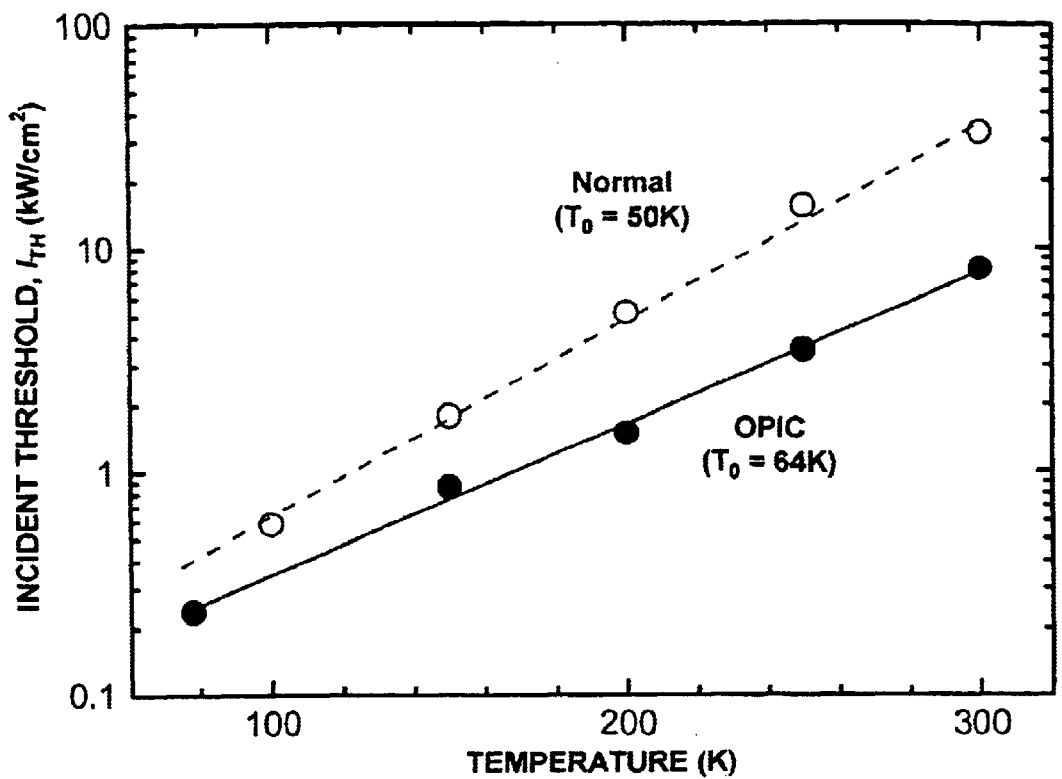
FIG. 11 compares the incident threshold intensities and the characteristic temperature of an OPIC with a standard configuration optically pumped laser.

FIG. 11 illustrates the results of another experiment comparing the behavior of the OPIC laser demonstrated in FIG. 9 and FIG. 10 with a standard configuration optically pumped laser. The incident threshold intensities were significantly lower for the OPIC laser than for the conventionally configured optically pumped laser with a similar output wavelength. At 300 K, the threshold is more than a factor of 4 lower for the OPIC laser. The characteristic temperature $T_0$, was also higher for the OPIC laser.

Based on the low thresholds and high efficiencies demonstrated for the OPIC laser of FIG. 11, it should easily operate cw at room temperature, and produce cw output powers on the order of 0.5 W at thermoelectric cooler temperatures, if used with a suitable continuous wave pump source.

Figure 12:
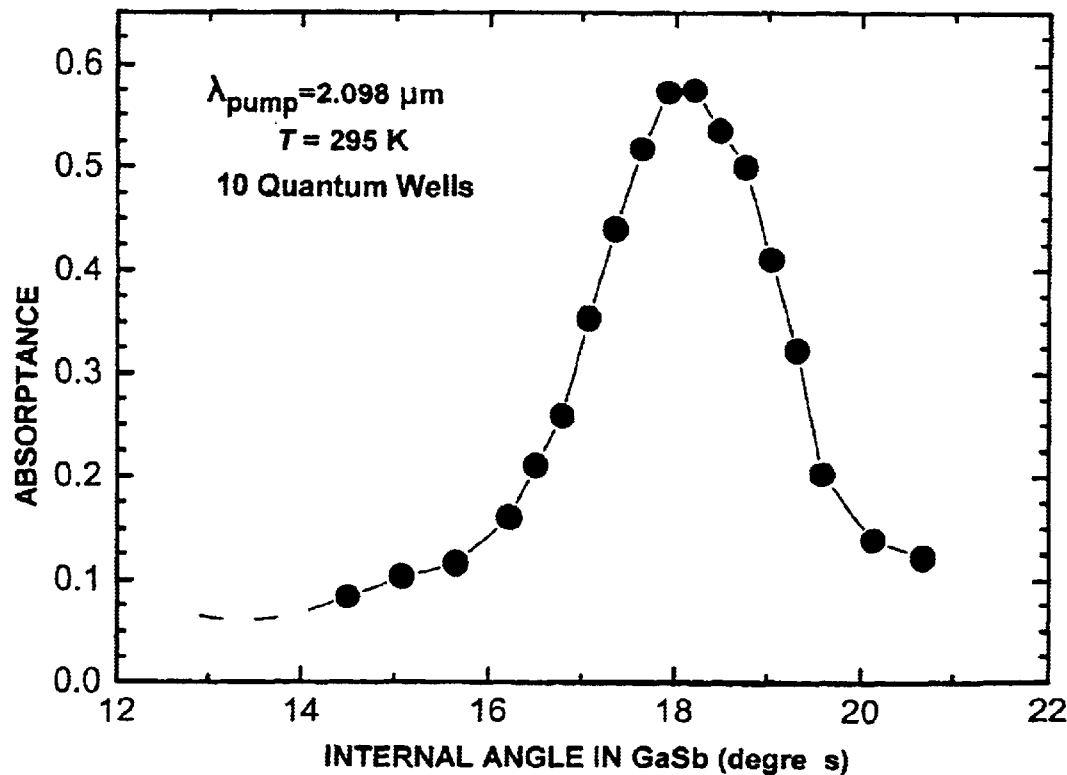
FIG. 12 illustrates the measured absorptance of a 10 quantum-well OPIC laser as a function of the coupling angle within the material.

FIG. 12 illustrates the results obtained by measuring the absorptance of a 10 quantum-well OPIC laser as a function of the coupling angle within the material. This measurement was conducted by placing a sample of the OPIC material between two 45° glass prisms, measuring the reflectance R and transmittance T as a function of the coupling angle, and calculating the absorptance A using the formula A=1−R−T. Pumping was by 107 ns pulses from a 2.098 Ho:YAG laser, operating at a repetition rate of 1 Hz. The cavity was fine-tuned to the pump beam by varying the incidence angle away from normal. The absorptance curve in FIG. 12 clearly shows a resonance in the angle of coupling, which is equivalent to a resonance in the coupling wavelength, as demonstrated in FIG. 11. FIG. 12 shows that the absorptance is strongly peaked at an internal angle of 18°, with a peak value of 57%. As predicted, this value is much higher than previous values of 16–27% measured in conventional configured optically pumped mid-IR laser material samples, having 50–80 quantum wells, at the same pump wavelength and similar emission wavelength).

Optical Pump Sources

Optical pumping sources can be described by the spectral pattern of their emission, as either broadband or narrowband. Typical broadband sources are flashlamps, which generate radiation over the entire spectral range from the infrared to the ultraviolet. Besides not being very efficient in general, flashlamps are not suitable for use in the OPIC configuration because any given design can bring only a small fraction of the wide range of incident wavelengths into resonance with the OPIC etalon cavity.

Optically pumped semiconductor lasers are more commonly pumped by a narrowband source, such as a laser diode, solid-state laser, or gas laser, which is suitable for the OPIC configuration. The optimum wavelength for the narrowband pump source is determined by a number of factors, not the least of which is availability. Because of the structure of the electronic bands, the strength of the absorption of the pump beam in the active region usually increases as the pump photon energy increases above the laser transition. However, each absorbed photon usually creates only one electron-hole pair, which in turn can emit only a single photon. Any excess heat due to this photon decrement will become waste heat in the active region, degrading the device performance. Therefore, there is usually a tradeoff in efficiency vs. heat generation as a function of pump wavelength.

Alternative Materials for OPIC Lasers

Examples of optical pumping injection cavity lasers discussed above are all within the mid-IR emission range (3–5 $\mu$m) in the 6.1 Å material family of semiconductors. These embodiments have been used to illustrate the operation of the OPIC lasers which are the subject of this invention. Ability to manufacture an OPIC laser depends on the ability to fabricate variable reflectance regions on either side of a laser active region, which can be accomplisheh using a wide variety of material combinations. The OPIC concept can therefore be employed in lasers using a large number of material systems and wavelength of operation regimes. Since semiconductor DBR mirror stacks are well known, especially in connection with VCSELs, the principles necessary to apply the OPIC laser design to these other regions should be obvious to one skilled in the art.

The sample OPIC for which test results are shown in FIGS. 10, 11, and 12 above used alternating ¼ wavelength layers of GaSb and $AlAs_{0.08}Sb_{0.92}$, where the composition of the ternary compound was chosen to match the lattice constant of GaSb. (High quality growth is usually more likely when growing thick layers of lattice matched material.) In general, DBR properties depend strongly on the difference in refractive indices of the two materials, and DBRs with larger differences in refractive index require fewer layers to attain the same plateau reflectivity. Here, the difference in refractive indices of the GaSb and the $AlAs_{0.08}Sb_{0.92}$ was relatively large ($\Delta n$ approximately equal to 0.6). For optically pumped lasers grown on GaSb substrates, GaSb and the $AlAs_{0.08}Sb_{0.92}$ are attractive candidates for the DBRs, as they are lattice matched to the substrate, each other, and probably to the active region as well (depending on material selection for the active region).

Another example of materials which may be used for the DBRs are GaAsSb and AlAsSb, both lattice-matched to an InAs substrate. Alternating index pairs for DBRs in optically pumped laser material systems with different lattice constraints can also be created, e.g., GaAs/AlGaAs on GaAs substrates, InGaAs/InAlAs or InGaAs/AlAsSb on InP, and InAs/AlAsSb on InAs, to name only a few. Although all of the examples given are III–V semiconductor materials, similar combinations also exist in the II–VI and IV–VI (lead salt) semiconductor systems, which will be clear to those skilled in the art. Thus, the necessary components of the DBR can potentially be realized in any optically pumped semiconductor laser material system. Because each of these material systems has a different dielectric constant ratio than the $GaSb/AlAs_{0.08}Sb_{0.92}$ pair, a different number of periods will be needed to optimize each DBR for each material system. In all cases, the active region is nearly arbitrary as long as its growth is compatible with that of the DBR layers and its total thickness (including any spacer layers) is appropriate to make a cavity for the pump wavelength. The general principles necessary to build an OPIC device using these material systems will be obvious to those skilled in the art.

Some or all of one or both of the reflectors required to create the OPIC etalon cavity may also be dielectric stacks that are deposited after the semiconductor growth by MBE or another process. One mirror may be a metallic layer, and both may be metallic if one is thin enough to transmit the pump beam into the cavity. While all of the structures discussed as examples herein have employed semiconductor active regions to produce gain, the OPIC invention described herein may also be applied to any gain medium which can be placed within an etalon cavity for the pump beam. Examples include gas lasers, solid state lasers, and organic polymer lasers. In each case, a variety of reflector materials may be used.

The OPIC concept may also be combined with other approaches to enhancing the absorptance of the pump beam. For example, the active quantum wells may be surrounded by "integrated absorber" layers, which absorb the pump beam but then donate the generated electrons and holes to the active quantum wells.

Alternative Methods of Fabrication

Several alternative methods may be used to build the OPIG devices discussed above. In the case of a semiconductor gain medium, the layers of the device may be deposited on the substrate during one continuous sample growth process. Alternatively, it is also possible to grow a partial device, and to complete the building of the structure in a later stage. For example, if the initial growth process includes growing the bottom reflector and either the whole OPIC cavity or part of the OPIC cavity including the active region, the incomplete structure may be evaluated to determine whether the growth was within design tolerances. The design of the remaining structure can then be adjusted to compensate for any discrepancies between the original design and the structure that was actually grown. The top reflector can be realized using any appropriate technology. Regrowth of the same semiconductor materials can be done on the wafer. The top DBR can be created through the use of layered oxides rather than semiconductor materials, which allows the use of sputtering instead of the generally more expensive semiconductor growth techniques. A DBR grown on a separate wafer can be attached by wafer fusion, allowing material systems with different lattice constants to be combined. If the optically pumped OPIC will be operating in a wavelength range where metallic coatings have acceptable losses, a metal layer can be used as the top reflector rather than a dielectric or oxide quarter-wave stack. This interrupted-growth technique also allows the researcher to grow a single wafer with a bottom reflector and OPIC cavity, cleave the sample into smaller pieces, and deposit different top-reflectors on each piece to verify possible design variations. The OPIC cavity can even be extended in size with a high-dielectric spacer layer before the deposition of the top reflector.

Obviously many modifications and variations of the present invention are possible in the light of the above teachings. It is therefore to be understood that the scope of the invention the invention should be determined by referring to the following appended claims.

We claim:

1. An apparatus for transmitting pump light to an active region that produces optical gain, wherein said apparatus is adapted to receive optical pump radiation having a wavelength $\lambda_p$, comprising:
   a first and second reflector, each reflector being reflective at said wavelength $\lambda_p$,
   said first and second reflectors disposed on opposite sides of said active region, and
   wherein the distance between said reflectors creates a cavity which is resonant at said pump wavelength $\lambda_p$.

2. An apparatus as in claim 1, wherein said first and said second reflectors are separated by a distance of about $m\lambda_p/2n \cos \theta$, where n is the average index of refraction of said material having an active region, $\theta$ is the angle that the pump beam transverses relative the normal of said reflectors, and m is any positive integer.

3. An apparatus as in claim 2, wherein the refractive index of said first and second reflectors is greater than or equal to the combined refractive index of said material having an active region.

4. An apparatus as in claim 2, wherein the refractive index of said first and second reflectors is less than the combined refractive index of said material having an active region.

5. An apparatus as in claim 2, wherein at least one of said first and second reflectors is a distributed Bragg reflector, and wherein said distributed Bragg reflector has alternating layers of high refractive index material and low refractive index material.

6. An apparatus as in claim 5, wherein both reflectors are distributed Bragg reflectors.

7. An apparatus as in claim 2, further comprising a heat sink.

8. An apparatus as in claim 2, further comprising means for maintaining the distance between said reflectors.

9. An optically pumped edge-emitting laser, adapted to receive optical pump radiation having a wavelength $\lambda_p$, comprising:
   a substrate,
   a first optical cladding layer, with a lower refractive index than the average refractive index of the active region,
   a first reflector disposed upon said substrate,
   material including an active region disposed upon said first reflector,
   a second reflector disposed upon said material having an active region,
   a second optical cladding layer, with a lower refractive index than the average refractive index of the active region,
   wherein said material having an active region and the adjacent surfaces of said reflectors together comprise a cavity which is resonant at wavelength $\lambda_p$.

10. A laser as in claim 9, wherein said first and said second reflectors are separated by a distance of about $m\lambda_p/2n \cos \theta$, where n is the average index of refraction of said material having an active region, $\theta$ is the angle that the pump beam transverses relative the normal of said reflectors, and m is any positive integer.

11. A laser as in claim 10, wherein said material having an active region comprises:
   said active region, and
   at least one spacer.

12. A laser as in claim 11, wherein said active region is located at a point of maximum field intensity.

13. A laser as in claim 11, wherein said spacer is GaSb.

14. A laser as in claim 10, wherein said material having an active region comprises:
   said active layer,
   a first spacer disposed between said first reflector and said active region, and
   a second spacer disposed between said active region and said second reflector.

15. A laser as in claim 10, wherein said material having an active region comprises a plurality of active layers, wherein said active layers are located at points of high field intensity, and wherein said active layers are separated by spacers.

16. A laser as in claim 10, wherein the average refractive indices of said first and second reflectors are both less than the combined refractive index of said material having an active region.

17. A laser as in claim 16, wherein said alternating layers of said distributed Bragg reflector has have an optical thickness of ¼ $\lambda_p$.

18. A laser as in claim 16, wherein said alternating layers are III–V semiconductor materials.

19. A laser as in claim 16, wherein said alternating layers are GaSb and $AlAs_{0.08}Sb_{0.92}$, and said substrate is GaSb.

20. A laser as in claim 10, wherein at least one of the first and second reflectors is a distributed Bragg reflector, and wherein said distributed Bragg reflector has alternating layers of high refractive index material and low refractive index material.

21. A laser as in claim 20, wherein both said first and second reflectors are distributed Bragg reflectors.

22. A laser as in claim 20, wherein said alternating layers are GaAsSb and AlAsSb, and said substrate is InAs.

23. A laser as in claim 20, wherein said alternating layers are InGaAs and InAlAs, and said substrate is InP.

24. A laser as in claim 20 wherein said alternating layers are InGaAs and AlAsSb, and said substrate is InP.

25. A laser as in claim 20, wherein said alternating layers are InAs and AlAsSb, and said substrate is InAs.

26. A laser as in claim 20, wherein said reflector and said substrate are II–VI semiconductor materials.

27. A laser as in claim 20, wherein said reflector and said substrate are IV–VI semiconductor materials.

28. A laser as in claim 20, wherein said alternating layers of at least one of said reflectors are layered oxides.

29. A laser as in claim 20, wherein said reflector and said substrate are group IV semiconductor materials.

30. A laser as in claim 10, further adapted for receiving pump radiation at a surface of second reflector opposite the surface adjacent to said active region, wherein the reflectance of said first reflector plus a double pass absorbance of said active region is about equal to the reflectance of said second reflector.

31. A laser as in claim 30, wherein both said first and second reflectors are distributed Bragg reflectors, said first and second distributed Bragg reflectors having alternating layers of high refractive index material and low refractive index material, and wherein said second distributed Bragg reflector has fewer alternating layers than said first distributed Bragg reflector.

32. A laser as in claim 10, further adapted for receiving pump radiation at a surface of second reflector opposite the surface adjacent to said active region, wherein the reflectance of said first reflector plus a double pass absorbance of said active region is about equal to the reflectance of said second reflector.

33. A laser as in claim 32, wherein both said first and second reflectors are distributed Bragg reflectors, said first and second distributed Bragg reflectors having alternating layers of high refractive index material and low refractive index material, and wherein said first distributed Bragg reflector has fewer alternating layers than said second distributed Bragg reflector.

34. A laser as in claim 10, further comprising a heat sink disposed on said substrate.

35. A laser as in claim 34, said heat sink being substantially transparent to said pump wavelength $\lambda_p$.

36. A laser as in claim 35, further comprising a coating substantially anti-reflective at the pump wavelength $\lambda_p$ disposed on said heat sink.

37. A laser as in claim 10, further comprising a heat sink disposed on said second reflector.

38. A laser as in claim 37, said heat sink being substantially transparent to said pump wavelength $\lambda_p$.

39. A laser as in claim 37, further comprising a coating substantially anti-reflective at the pump wavelength $\lambda_p$ disposed on said heat sink.

40. A laser as in claim 10, further comprising reflective means disposed upon said substrate at a side of said substrate opposite said second reflector.

41. A laser as in claim 10, adapted to emit laser radiation having a wavelength $\lambda_{out}$ in a direction substantially planar to said active region, and wherein said active region has first and second boundaries with reflectivities greater than zero to provide feedback, said first and second boundaries defining a laser cavity having a length, said laser cavity resonant at $\lambda_{out}$.

42. A laser as in claim 41, wherein said length of said laser cavity is between about 250 um and about several millimeters.

43. A laser as in claim 42, wherein said first and second boundaries are cleaved facets, partly reflective at said laser emission wavelength $\lambda_{out}$.

44. A laser as in claim 10, further adapted to emit laser emission in a direction substantially perpendicular to the plane of the active region.

45. A laser as in claim 44, wherein said laser has a laser cavity parallel to said cavity resonant at the wavelength $\lambda_p$, said laser cavity resonant at laser emission wavelength $\lambda_{out}$.

46. A laser as in claim 45, wherein said laser cavity is defined by said first and second reflectors, and wherein said laser cavity is resonant at said pump wavelength $\lambda_p$ and said laser emission wavelength $\lambda_{out}$.

47. A laser as in claim 10, wherein each of said first and second reflectors comprises alternating layers, and whereas each said layer comprises a composition selected from the group consisting of GaSb, AlSb, InAs, AlAsSb, GaAsSb, AlGaAsSb, or ternary or higher order combinations thereof, and combinations thereof.

48. A laser as in claim 10, wherein each of said first and second reflectors comprises alternating layers, and whereas each said layer comprises a composition selected from the group consisting of one or more elements selected from Groups III–V, II–VI, IV–VI, or group IV elements, and combinations thereof.

49. A laser as in claim 10, wherein each of said first and second reflectors comprises a metallic layer having a composition selected from the group consisting of a noble or low-loss metal, and combination thereof.

50. A laser as in claim 10, wherein one of said first and second reflectors is a metal film.

* * * * *